United States Patent
Lai

(10) Patent No.: US 8,016,495 B2
(45) Date of Patent: Sep. 13, 2011

(54) LENS, LENS MODULE, AND CAMERA MODULE HAVING SAME

(75) Inventor: Cheng-Yi Lai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/843,794

(22) Filed: Jul. 26, 2010

(65) Prior Publication Data
US 2011/0158633 A1   Jun. 30, 2011

(30) Foreign Application Priority Data
Dec. 30, 2009 (TW) .................................. 98145928

(51) Int. Cl.
*G03B 17/00* (2006.01)

(52) U.S. Cl. ....................................................... 396/439
(58) Field of Classification Search .................... 396/439
See application file for complete search history.

(56) References Cited

U.S. PATENT DOCUMENTS
2008/0118241 A1* 5/2008 TeKolste et al. .............. 396/439
* cited by examiner

*Primary Examiner* — Christ Mahoney
*Assistant Examiner* — Linda B Smith
(74) *Attorney, Agent, or Firm* — Altis Law Group, Inc.

(57) ABSTRACT

A lens includes a light incident surface, a light emitting surface opposite to the light incident surface, and a side surface connected between the light incident surface and the light emitting surface. The side surface includes arc-shaped convex surfaces. Each arc-shaped convex surface protrudes in a direction perpendicular to an optical axis of the lens.

15 Claims, 2 Drawing Sheets

LENS, LENS MODULE, AND CAMERA MODULE HAVING SAME

BACKGROUND

1. Technical Field

The present disclosure relates to a lens, a lens module, and a camera module having the lens.

2. Description of Related Art

Nowadays, camera modules are in widespread use in various kinds of electronic devices, such as digital cameras, cell phones, and laptop computers.

A camera module typically includes a number of lenses and an image sensor. When light enters the camera module, the surfaces of the lenses may reflect a part of the light. Typically, all the surfaces of the lenses reflect a part of the light before the light reaches the image sensor. Some of the reflected light is further reflected and thus redirected to the image sensor. The cumulative effect of all such multiple reflections of light may cause flare on the image captured by the image sensor.

Therefore, it is desirable to provide a new lens, a new lens module, and a new camera module, which can overcome the above-mentioned limitations.

DETAILED DESCRIPTION

Figure 1:
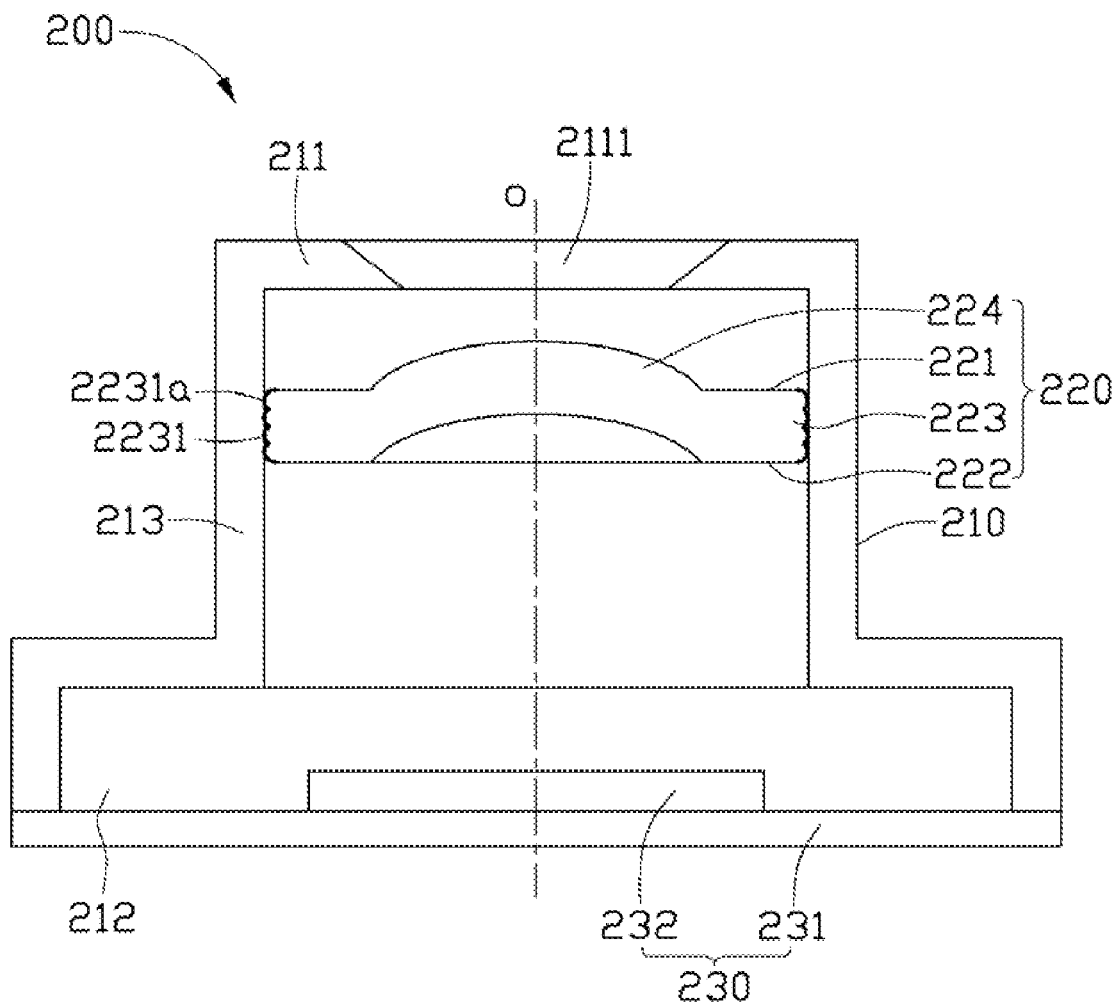
FIG. 1 is a cross-sectional view of a camera module according to an exemplary embodiment.
Figure 2:
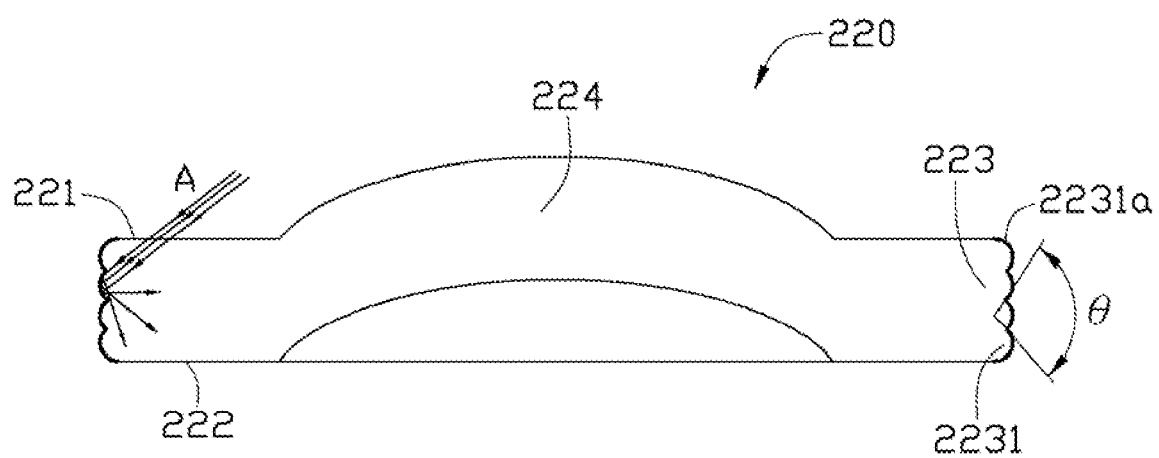
FIG. 2 is a cross-sectional view of a lens of the camera module of FIG. 1.

Referring to FIGS. 1-2, a camera module 200 according to an exemplary embodiment is shown. The camera module 200 includes a barrel 210, a lens 220, and an image sensing module 230. The lens 220 is accommodated in the receiving space 212 of the barrel 210. The image sensing module 230 is arranged at the bottom of the lens barrel 210.

The barrel 210 is a hollow cylinder, and includes a top wall 211 and a sidewall 213. The top wall 211 and the sidewall 213 cooperatively define a receiving space 212. The top wall 211 defines a light incident hole 2111.

The lens 220 is a circular lens, and has an optical axis O. The lens 220 includes a light incident surface 221, a light emitting surface 222, and a substantially cylindrical side surface 223 connected between the light incident surface 221 and a light emitting surface 222. The lens 220 includes an optically active section 224 at the central portion thereof. The optically active section 224 aligns with the light incident hole 2111. The side surface 223 includes a number of interconnected arc-shaped convex surfaces 2231. In the present embodiment, the side surface 223 includes four interconnected arc-shaped convex surfaces 2231. Each arc-shaped convex surface protrudes in a direction perpendicular to the optical axis O of the lens. Each arc-shaped convex surface subtends a central angle θ, which is in an approximate range from about 1 degree to about 179 degrees. The side surface 223 includes a light blocking film 2231a formed on the arc-shaped convex surfaces 2231. The light blocking film 2231a is for preventing light emitting from the side surface 223.

The image sensing module 230 includes a substrate 231 and an image sensing unit 232. The substrate 231 is made of plastic or ceramic. The image sensing unit 232 is received in the receiving space 212 of the barrel 210, and fixed on the substrate 231.

In use, when a light beam A with three substantially parallel light rays reaches the arc-shaped convex surfaces 2231, the three substantially parallel light rays are reflected in different directions, thus preventing all of the three light rays from reflecting to the image sensing unit 232. Simultaneously, the light blocking film 2231a prevents light from emitting through the arc-shaped convex surfaces 2231 and reflecting to the image sensing unit 232 with the inner surface of the sidewall 213. Accordingly, image flare caused by multiple reflections can be reduced or even eliminated altogether.

While various embodiments have been described, it is to be understood that the disclosure is not limited thereto. To the contrary, various modifications and similar arrangements (as would be apparent to those skilled in the art), are also intended to be covered. Therefore, the scope of the appended claims should be accorded the broadest interpretation so as to encompass all such modifications and similar arrangements.

What is claimed is:

1. A lens comprising:
   a light incident surface;
   a light emitting surface opposite to the light incident surface; and
   a side surface connected between the light incident surface and the light emitting surface, the side surface comprising a plurality of arc-shaped convex surfaces, each arc-shaped convex surface protruding in a direction perpendicular to an optical axis of the lens.

2. The lens of claim 1, wherein a light blocking film formed on each of the arc-shaped convex surfaces.

3. The lens of claim 1, wherein each of the arc-shaped convex surfaces subtends a central angle, and the central angle is in a range from 1 degree to 179 degrees.

4. The lens of claim 1, wherein the lens is circular, and the side surface is a substantially cylindrical surface.

5. The lens of claim 1, wherein two adjacent arc-shaped convex surfaces are interconnected with each other.

6. A lens module comprising:
   a barrel having a sidewall, the sidewall defining a receiving space therein;
   a lens accommodated in the receiving space of the barrel, the lens comprising:
      a light incident surface;
      a light emitting surface opposite to the light incident surface; and
      a side surface connected between the light incident surface and the light emitting surface, the side surface comprising a plurality of arc-shaped convex surfaces, each arc-shaped convex surface protruding in a direction perpendicular to an optical axis of the lens.

7. The lens module of claim 1, wherein a light blocking film formed on each of the arc-shaped convex surfaces.

8. The lens module of claim 1, wherein each of the arc-shaped convex surfaces subtends a central angle, and the central angle is in a range from 1 degree to 179 degrees.

9. The lens module of claim 1, wherein the lens is circular, and the side surface is a substantially cylindrical surface.

10. The lens module of claim 1, wherein two adjacent arc-shaped convex surfaces are interconnected with each other.

11. A camera module comprising:
    a barrel having a sidewall, the sidewall defining a receiving space therein;
    a lens accommodated in the receiving space of the barrel, the lens comprising:
       a light incident surface;
       a light emitting surface opposite to the light incident surface; and a side surface connected between the light incident surface and the light emitting surface, the side surface comprising a plurality of arc-shaped convex surfaces, each arc-shaped convex surface protruding in a direction perpendicular to an optical axis of the lens; and an image sensing unit accommodated in the receiving space of the barrel, the image sensing unit being in optical alignment with the lens.

12. The camera module of claim 1, wherein a light blocking film formed on each of the arc-shaped convex surfaces.

13. The camera module of claim 1, wherein each of the arc-shaped convex surfaces subtends a central angle, and the central angle is in a range from 1 degree to 179 degrees.

14. The camera module of claim 1, wherein the lens is circular, and the side surface is a substantially cylindrical surface.

15. The camera module of claim 1, wherein two adjacent arc-shaped convex surfaces are interconnected with each other.

* * * * *